(12) United States Patent
Kelman et al.

(10) Patent No.: US 9,156,740 B2
(45) Date of Patent: Oct. 13, 2015

(54) CERAMIC BORON-CONTAINING DOPING PASTE AND METHODS THEREFOR

(75) Inventors: Maxim Kelman, Mountain View, CA (US); Elena Rogojina, Los Altos, CA (US); Gonghou Wang, Foster City, CA (US)

(73) Assignee: Innovalight, Inc., Sunnyvale, CA (US)

( * ) Notice: Subject to any disclaimer, the term of this patent is extended or adjusted under 35 U.S.C. 154(b) by 657 days.

(21) Appl. No.: 13/099,794

(22) Filed: May 3, 2011

(65) Prior Publication Data

US 2012/0280183 A1    Nov. 8, 2012

(51) Int. Cl.
| | | |
|---|---|---|
| *C04B 41/49* | (2006.01) | |
| *C04B 35/626* | (2006.01) | |
| *C04B 35/117* | (2006.01) | |
| *C04B 35/46* | (2006.01) | |
| *C04B 35/636* | (2006.01) | |
| *H01L 31/0224* | (2006.01) | |
| *H01L 31/068* | (2012.01) | |
| *H01L 21/22* | (2006.01) | |

(52) U.S. Cl.
CPC ........... *C04B 35/6263* (2013.01); *C04B 35/117* (2013.01); *C04B 35/46* (2013.01); *C04B 35/6264* (2013.01); *C04B 35/6365* (2013.01); *H01L 21/2225* (2013.01); *H01L 31/022425* (2013.01); *H01L 31/068* (2013.01); *C04B 2235/3409* (2013.01); *C04B 2235/3804* (2013.01); *C04B 2235/386* (2013.01); *C04B 2235/3813* (2013.01); *C04B 2235/3821* (2013.01); *C04B 2235/3891* (2013.01); *C04B 2235/421* (2013.01); *Y02E 10/547* (2013.01)

(58) Field of Classification Search
USPC ................................ 252/501.1, 950; 313/506; 106/287.14–287.17, 287.29
See application file for complete search history.

(56) References Cited

U.S. PATENT DOCUMENTS

| | | | |
|---|---|---|---|
| 4,104,091 A | | 8/1978 | Evans, Jr. et al. |
| 6,695,903 B1 * | | 2/2004 | Kubelbeck et al. ...... 106/287.14 |
| 2001/0043106 A1 * | | 11/2001 | Kadowaki et al. ............ 327/291 |
| 2007/0252523 A1 * | | 11/2007 | Maeda et al. ................. 313/506 |

FOREIGN PATENT DOCUMENTS

CN         101168472         *   4/2008

OTHER PUBLICATIONS

Hubbard et al., Thermodynamic stability of binary oxides in contact with silicon, Nov. 1996, J. Mater. Res., vol. 11, 2757-2776.*
Altermatt et al., "Rear surface passivation of high-efficiency silicon solar cells by a floating junction," J. Appl. Phys., Sep. 15, 1996, 80(6):3574-3586.
Blakers et al., "22.8% efficient silicon solar cell," Appl. Phys. Lett., Sep. 25, 1989, 55(13):1363-1365.
Hubbard et al., "Thermodynamic stability of binary oxides in contact with silicon," J. Mater. Res., Nov. 1996, 11(11):2757-2776.
Wang et al., "24% efficient silicon solar cells," Appl. Phys. Lett., Aug. 6, 1990, 57(6):602-604.
Zhao et al., "High efficiency PERT cells on N-type silicon substrates," 29th IEEE Photovoltaics Specialist Conference, New Orleans, 2002, 218-221.

* cited by examiner

*Primary Examiner* — Monique Peets
(74) *Attorney, Agent, or Firm* — Foley & Lardner LLP (57) ABSTRACT

A ceramic boron-containing dopant paste is disclosed. The ceramic boron-containing dopant paste further comprising a set of solvents, a set of ceramic particles dispersed in the set of solvents, a set of boron compound particles dispersed in the set of solvents, a set of binder molecules dissolved in the set of solvents. Wherein, the ceramic boron-containing dopant paste has a shear thinning power law index n between about 0.01 and about 1.

18 Claims, 10 Drawing Sheets

CERAMIC BORON-CONTAINING DOPING PASTE AND METHODS THEREFOR

FIELD OF DISCLOSURE

This disclosure relates in general to p-n junctions and in particular to a ceramic boron-containing doping paste and methods therefor.

BACKGROUND

A solar cell converts solar energy directly to DC electric energy. Generally configured as a photodiode, it permits light to penetrate into the vicinity of metal contacts such that a generated charge carrier (electrons or holes (a lack of electrons)) may be extracted as current. And like most other diodes, photodiodes are formed by combining p-type and n-type semiconductors to form a junction.

Electrons on the p-type side of the junction within the electric field (or built-in potential) may then be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc. The built-in potential and thus magnitude of electric field generally depend on the level of doping between two adjacent layers.

Figure 1:
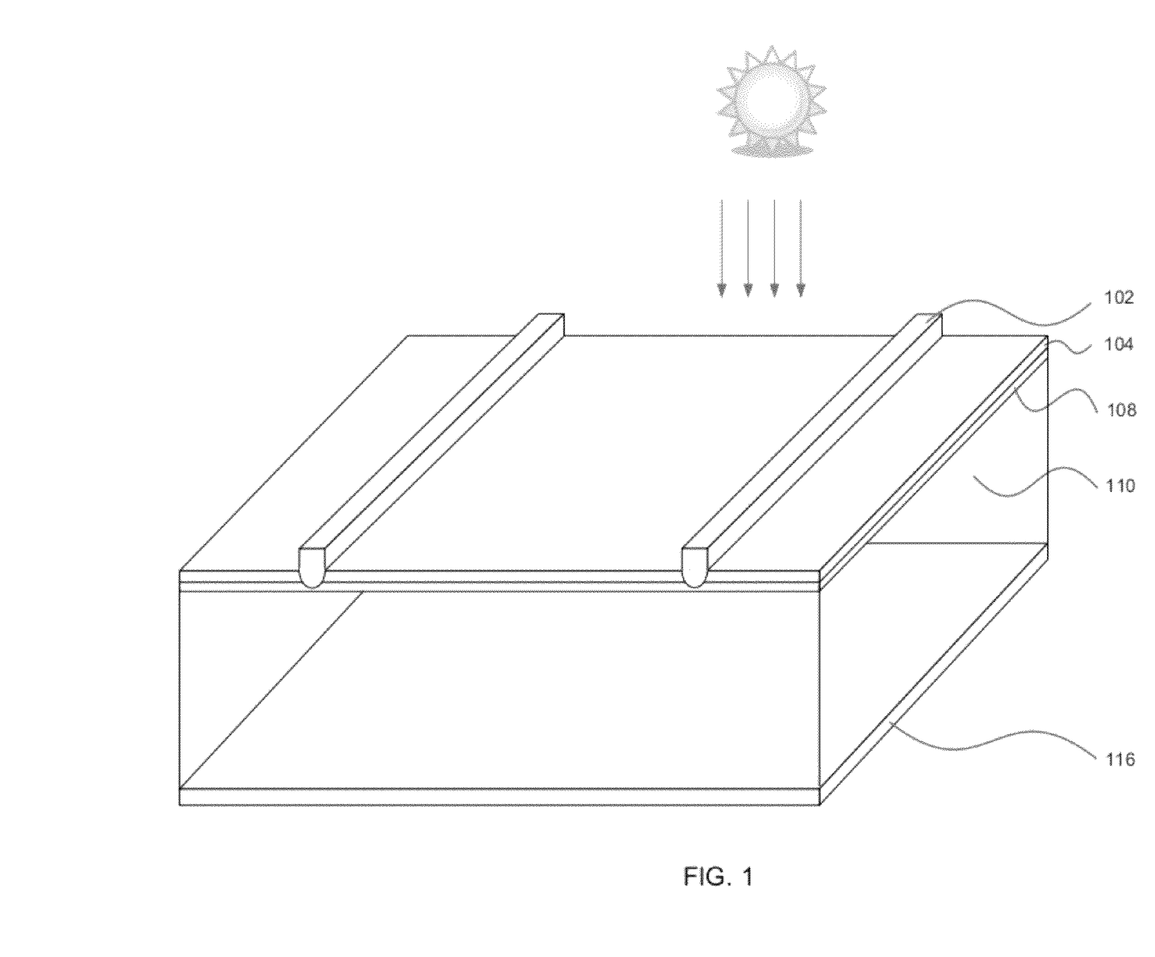
FIG. 1 shows a simplified diagram of a traditional front-contact solar cell.

Referring now to FIG. 1, a simplified diagram of a conventional solar cell is shown. In general, a moderately doped diffused emitter region 108 is generally formed above a relatively light and counter-doped diffused region absorber region 110. In addition, prior to the deposition of silicon nitride (SiN$_x$) layer 104 on the front of the substrate, the set of metal contacts, comprising front-metal contact 102 and back surface field (BSF)/back metal contact 116, are formed on and fired into silicon substrate 110.

In a common configuration, a light n-type phosphorous-doped diffused region 108 (generally called the emitter or field), is formed by exposing the boron-doped substrate to POCl$_3$ (phosphorus oxychloride) ambient to form phosphosilicate glass (PSG) on the surface of the wafer. The reduction of phosphorus pentoxide by silicon releases phosphorus into the bulk of the substrate and dopes it. The reaction is typically:

[Equation 1A]

[Equation 1B]

[Equation 2]

The POCl$_3$ ambient typically includes nitrogen gas (N$_2$ gas) which is flowed through a bubbler filled with liquid POCl$_3$, and a reactive oxygen gas (reactive O$_2$ gas) configured to react with the vaporized POCl$_3$ to form the deposition (processing) gas. In general, the reduction of P$_2$O$_5$ to free phosphorous is directly proportional to the availability of Si atoms.

During the diffusion process, the substrates are loaded in either a back-to-back configurations with two substrates per slot, or in a single wafer per slot configuration, such that all substrate surfaces exposed to the furnace ambient are doped with phosphorus.

Prior to the deposition of silicon nitride (SiN$_x$) layer 104 on the front of the substrate, residual surface glass (PSG) formed on the substrate surface during the POCl$_3$ deposition process may be removed by exposing the doped silicon substrate to an etchant, such as hydrofluoric acid (HF). The set of metal contacts, comprising front-metal contact 102 and BSF (back surface field)/back metal contact 116, are then sequentially formed on and subsequently fired into doped silicon substrate 110.

The front metal contact 102 is commonly formed by depositing an Ag (silver) paste, comprising Ag powder (about 70 to about 80 wt % (weight percent)), lead borosilicate glass (frit) PbO—B$_2$O$_3$—SiO$_2$ (about 1 to about 10 wt %), and organic components (about 15 to about 30 wt %). After deposition the paste is dried at a low temperature to remove organic solvents and fired at high temperatures to form the conductive metal layer and to enable the silicon-metal contact.

BSF/back metal contact 116 is generally formed from aluminum (in the case of a p-type substrate) and is configured to create a potential barrier that repels and thus minimizes the impact of minority carrier rear surface recombination. In addition, Ag pads [not shown] are generally applied onto BSF/back metal contract 116 in order to facilitate soldering for interconnection into modules.

However, the use of aluminum may also be problematic for multiple reasons. As a result of thermal expansion mismatch between the silicon wafer and the aluminum layer, an aluminum BSF tends to cause solar cell warping, which leads to difficulties in subsequent production processes and decreases the yield due to increased breakage. Aluminum is also a poor reflector for the red light that is not absorbed by the wafer, reducing the solar cell efficiency. In addition, aluminum generally provides sub-optimal passivation to the substrate rear surface.

One solution may be to replace the blanket aluminum with a more reflective and better passivated layer in order to reduce charge carrier recombination and increase the absorption of long wavelength light. Additionally, the rear metal contact area may also be reduced to further optimize charge carrier recombination.

Solar cells configured with this architecture are commonly referred to as PERC (Passivated Emitter and Rear Cell) an architecture that was first introduced in 1989 by the University of New South Wales [A. W. Blakers, et al., Applied Physics Letters, 55 (1989) 1363-1365]. The devices fabricated in that study used heavily doped substrates as well as numerous expensive processing steps that are not compatible with high throughput manufacturing. Other versions of this cell architecture were later introduced as options to further increase the efficiency. Most notable among them is the PERL (passivated emitter rear locally diffused) [A. Wang, et al. J. Appl. Phys. Lett. 57, 602, (1990)], PERT (passivated emitter, rear totally diffused) [J. Zhao, A. Wang, P. P. Altermatt, M. A. Green, J. P. Rakotoniaina and O. Breitenstein, 29th IEEE Photovoltaic Specialist Conference, New Orleans, p. 218, (2002)], and PERF (passivated emitter rear floating junction) cells [P. P. Altermatt, et al. J. Appl. Phys. 80 (6), September 1996, pp. 3574-3586]. Similar to the original PERC cell, these architectures are expensive to manufacture. Since their introduction there have been numerous attempts to develop an industrially viable approach to make these cells.

In an alternate configuration, a selective emitter solar cell architecture on the front of the wafer may be used to further optimize solar cell efficiency. A selective emitter uses a first lightly doped region optimized for low recombination, and a second heavily doped region (of the same dopant type) optimized for low resistance ohmic metal contact.

Figure 2:
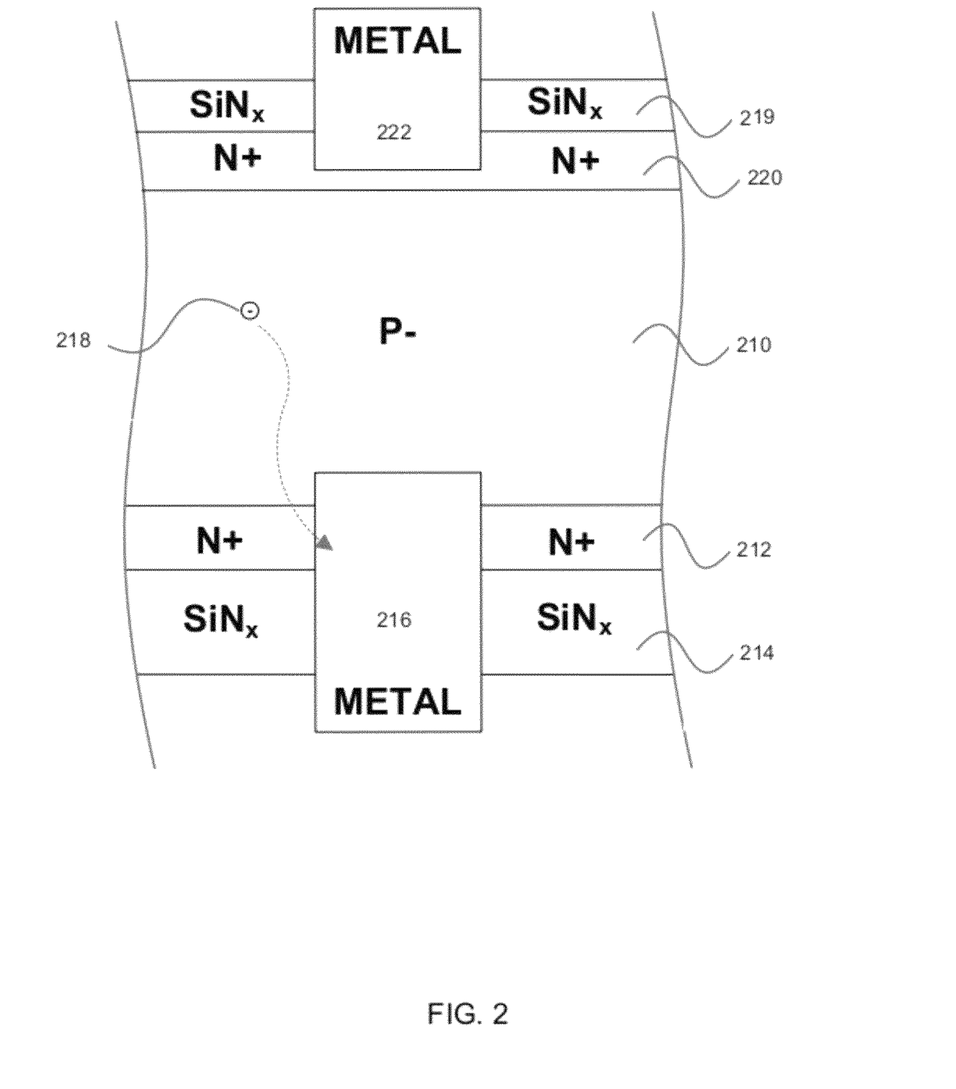
FIG. 2 shows a simplified diagram of a solar cell with rear passivated and reduced rear area metal contact on a p− (boron doped) substrate with an n+ (phosphorous doped) emitter region.

Referring now to FIG. 2, a simplified diagram is shown of a solar cell with rear passivated and reduced rear area metal contact on a p− (boron doped) substrate 210 with an n+ (phosphorous doped) emitter region 220.

Here, a set of front metal contacts 222 connects to n+ emitter region 220 through front surface $SiN_x$ layer 219 in order to form an Ohmic contact. $SiN_x$ layer 219 is generally configured to passivate the front surface as well as to minimize light reflection from the top surface of the solar cell.

Likewise, the set of back metal contacts 216 connects with substrate 210 through back surface passivation layer 214 (such as $SiN_x$) in order to also make an Ohmic contact.

However, the solar cell conversion efficiency of this architecture may also be problematic. For example, the presence of a metal layer in direct contact with the weakly-doped base wafer will tend to result in high contact resistance (i.e., a non-Ohmic contact). In addition, direct contact between n+ layer 212 (a byproduct of the $POCl_3$ diffusion process) and the set of back metal contacts 216 will also tend to result in a shunted junction that further reduces device efficiency.

One solution may be to use a doping paste to form a localized p+ (heavily doped) region between n+ layer 212 and the set of back metal contacts 216 in order to minimize detrimental shunting. However, the use of conventional dopant pastes is problematic since they are generally comprised of $SiO_2$ matrix with an addition of dopant containing compounds (see U.S. Pat. No. 4,104,091 and U.S. Pat. No. 6,695, 903).

Aside from detrimental auto doping (the creation of volatile dopant species which dope unwanted surface areas away from the intended deposition area), conventional doping pastes are generally unable to mask ambient $POCl_3$ (the absence of which would counter-dope the local region to a detrimental n-type and thus shunt).

In addition, because glasses (such as $SiO_2$) tend to reflow at the temperatures required for dopant diffusion, and because this temperature is further reduced by the addition of dopants, it is difficult to created patterned features with traditional dopant pastes. Furthermore, because the paste matrix is silicon oxide, conventional dopant pastes are generally not compatible with HF-based acidic chemistries typically used to clean the substrate surface after paste deposition and prior to the diffusion process.

In view of the foregoing, there is a desire for a doping paste that is resilient to high temperature oxidizing processes (such as the $POCl_3$ diffusion process), is able to mask ambient $POCl_3$, and is compatible with HF-based acidic cleaning chemistries.

SUMMARY

The invention relates, in one embodiment, to a ceramic boron-containing dopant paste. The ceramic boron-containing dopant paste further comprises a set of solvents, a set of ceramic particles dispersed in the set of solvents, a set of boron compound particles dispersed in the set of solvents, and a set of binder molecules dissolved in the set of solvents. Wherein, the ceramic boron-containing dopant paste has a shear thinning power law index n between about 0.01 and about 1.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, solar cell architectures that avoid a blanket aluminum BSF may provide increased efficiency by allowing a low resistivity and low recombination contact to the bulk of the wafer. However, such configurations are also problematic to manufacture since the presence of metal layer in direct contact with the weakly-doped base wafer will tend to result in a non-Ohmic contact. In addition, direct contact between a formed n+ layer (as a result of the $POCl_3$ diffusion process) and the set of back metal contacts will also tend to result in a shunted junction that further reduces device efficiency.

In an advantageous manner, a beneficial (non-shunting) Ohmic contact may formed between rear metal electrode 216 and substrate 210 by a p+ (heavily doped) region between the metal layer and the base wafer with a ceramic boron-containing doping paste, in accordance with the invention.

In contrast to conventional doping pastes, a ceramic boron-containing doping paste tends to be resilient to high temperature oxidizing processes (often associated with the dopant diffusion process), tends to mask ambient $POCl_3$ (the absence of which would counter-dope the local region to a detrimental n-type and thus shunt), and is compatible with HF-based acidic cleaning chemistries typically used after dopant deposition prior to the high temperature diffusion process (since silicon oxide is generally absent). Methods of depositing the ceramic boron-containing doping paste include, but are not limited to, screen printing, roll coating, slot die coating, gravure printing, flexographic drum printing, and inkjet printing methods, etc.

Figure 3A:
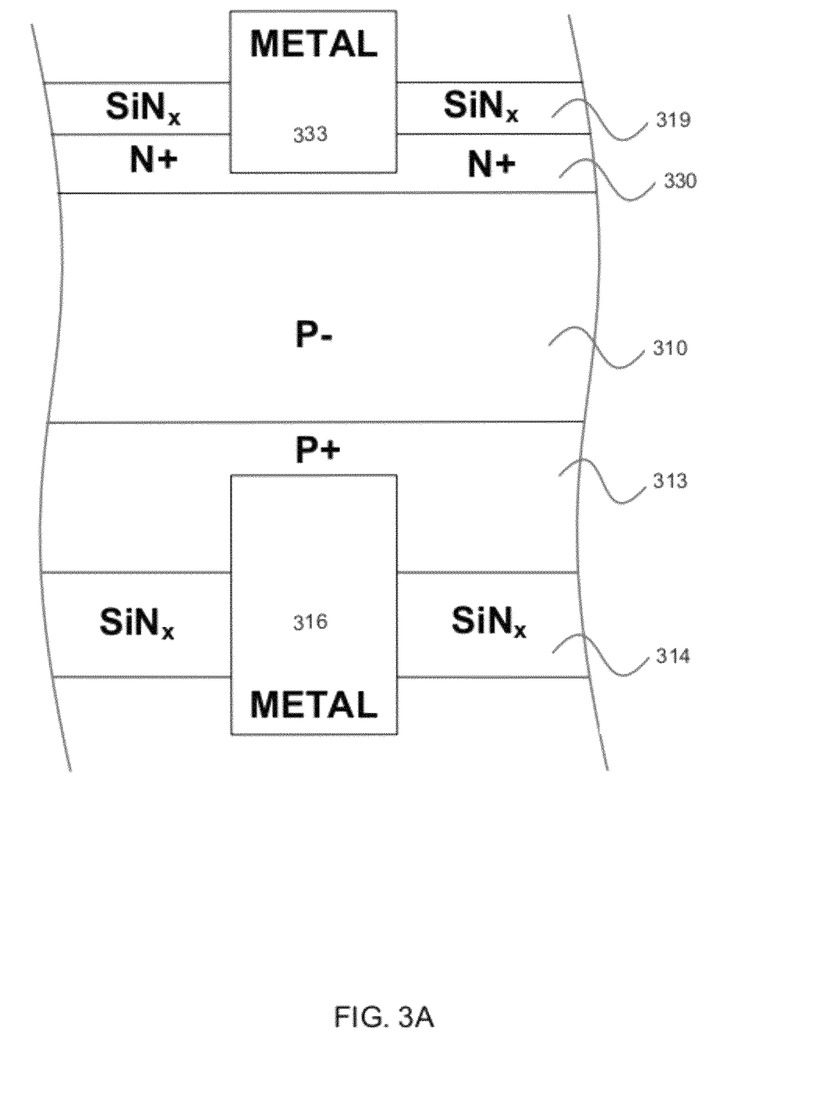
FIGS. 3A-B show a set of diagrams of different solar cell configurations in which a ceramic boron-containing doping paste may be used to configure a beneficial (non-shunting) Ohmic contact between a rear metal electrode and substrate, in accordance with the invention.
Figure 3B:
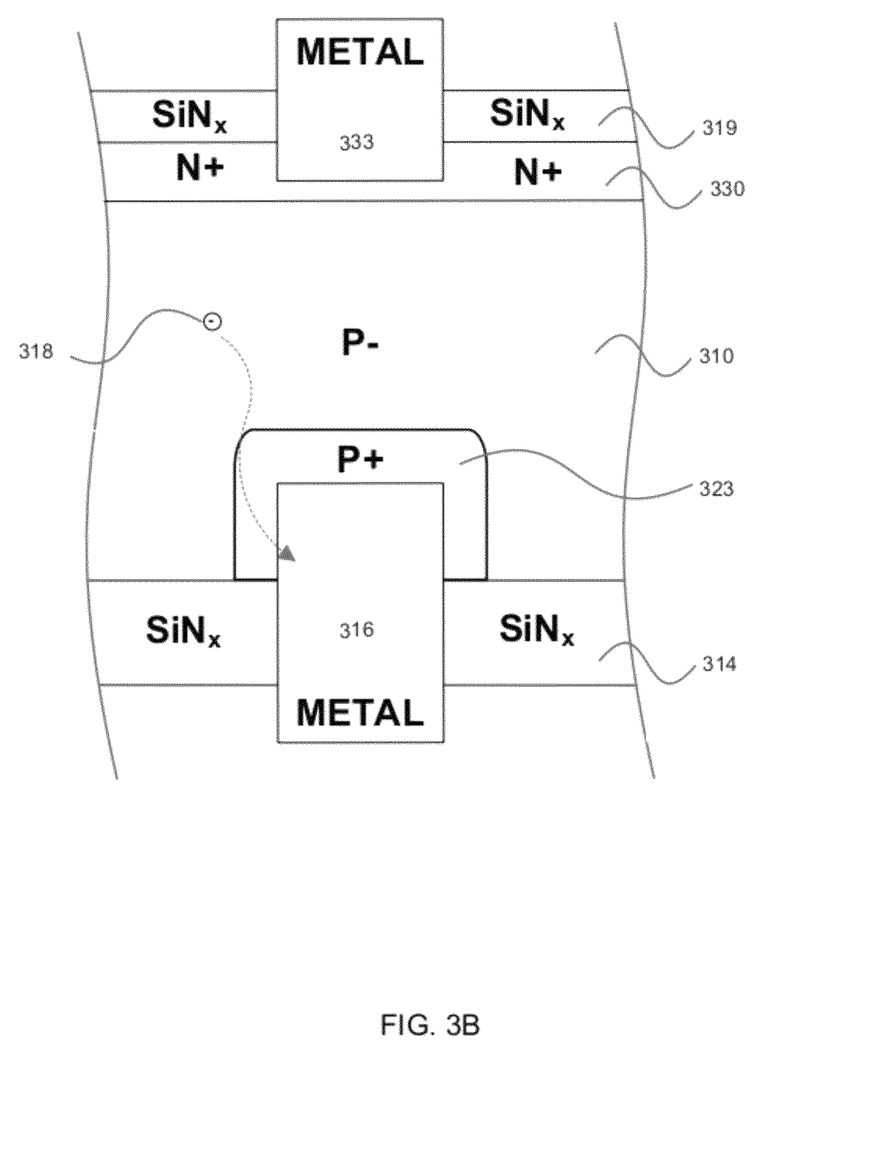

Referring now to FIGS. 3A-B, a set of diagrams showing different solar cell configurations in which ceramic boron-containing doping paste may be used to configure a beneficial (non-shunting) Ohmic contact between a rear metal electrode and substrate, in accordance with the invention.

FIG. 3A shows a solar cell configuration in which a p+ blanket BSF, formed with a ceramic boron-containing doping paste, forms a non-shunting Ohmic contact with the set of rear metal contacts, in accordance with the invention. As previously described, the presence of a p+ layer on the rear of the substrate will substantially reduce the detrimental impact of direct metal contact to the n+ and p− layers.

Here, a set of front metal contacts 333 connects to n+ emitter region 330 through front surface $SiN_x$ layer 319 in order to form an Ohmic contact. $SiN_x$ layer 319 is generally configured to passivate the front surface as well as to minimize light reflection from the top surface of the solar cell. In an alternate configuration, $SiN_x$ layer 319 is replaced with dielectric passivation (such as $SiO_x$ or a $SiO_x/SiN_x$ multilayer).

In contrast to FIG. 2, set of back metal contacts 316 connects with substrate 310 through back surface passivation layer 314 (such as $SiN_x$) and blanket BSF 313 in order to make a non-shunting Ohmic contact. In an alternate configuration, $SiN_x$ layer 314 is replaced with dielectric passivation (such as $SiO_x$ or a $SiO_x/SiN_x$ multilayer).

FIG. 3B shows a solar cell configuration in which a p+ localized BSF, formed with a ceramic boron-containing doping paste, forms a non-shunting Ohmic contact with the set of rear metal contacts, in accordance with the invention.

Here, a set of front metal contacts 322 connects to n+ emitter region 320 through front surface $SiN_x$ layer 319 in order to form an Ohmic contact. $SiN_x$ layer 319 is generally configured to passivate the front surface as well as to minimize light reflection from the top surface of the solar cell.

In contrast to FIG. 2, set of back metal contacts 316 connects with substrate 310 through back surface passivation layer 314 (such as $SiN_x$) and localized BSF 323 in order to make a non-shunting Ohmic contact. In addition, a residual n+ floating junction created during the $POCl_3$ diffusion process, provided it does not provide a shunting path to n+ emitter region 320, helps to reduce charge carrier recombination. [C. B. Honsberg, Solar Energy Materials and Solar Cells 34, Issues 1-4, 1 Sep. 1994, Pages 117-123].

As discussed above, there are several methods of depositing the ceramic boron-containing doping paste. Screen printing, in particular, is beneficial for the deposition of the paste since it is commonly used in solar cell manufacturing for the deposition of front and rear metal pastes. And like metal pastes, ceramic boron-containing doping paste must be configured as a non-Newtonian or shear-thinning fluid.

Non-Newtonian fluid refers to a fluid whose flow properties are not described by a single constant value of viscosity, or resistance to flow. Shear thinning refers to a fluid whose viscosity decreases with increasing rate of shear. In general, shear thinning behavior is observed in colloidal suspensions, where the weak hydrostatic and electrostatic interaction between particles and their surface groups tends to increase viscosity in non-dynamic force regimes. The addition of a relatively small shear force overcomes the hydrostatic interaction and thus tends to reduce the viscosity of the fluid.

Consequently, the viscosity of the paste must be relatively low at high shear rates in order to pass through a screen pattern, but must be relatively high prior to and after deposition (at low or zero shear rates), in order not to run through the screen or on the substrate surface respectively.

Generally, shear thinning is the result of particle-to-particle interactions in the fluid. Functionalization of the particle surface with surface groups increases inter-particle interactions resulting in stronger shear thinning behavior for the same solid loading.

For a shear thinning fluid, its viscosity can be related to the shear rate by the power law or Ostwald rheological model:

$$\eta = K\dot{\gamma}^{n-1} \quad \text{[Equation 4]}$$

where
$\eta$=viscosity;
$\dot{\gamma}$=shear rate;
K=consistency coefficient; and
n is a Power Law Index (or Rate Index).

Consequently, Equation 4 can be rewritten by taking a natural logarithm of both sides $$\log(\eta) = \log(K) + (n-1)\log(\dot{\gamma}) \quad \text{[Equation 5]}$$

Plotting the logarithm of the viscosity versus the logarithm of the shear rate will result in a straight line, with a slope of (n−1) that corresponds to the shear thinning of the fluid. In general, for a shear thinning fluid 0<n<1, with increased shear thinning behavior for smaller n values.

A refractory ceramic matrix selected for thermal stability in contact with the silicon substrate may be combined with a boron doping source to form the ceramic boron-containing doping paste. During the high temperature diffusion process, boron is allowed to diffuse into the substrate, while ambient phosphorous is blocked by the ceramic material.

While multiple ceramic materials have melting points compatible with the diffusion process, a smaller subset is compatible with the silicon substrate because some of the oxide materials in contact with silicon at an elevated temperature may get reduced introducing impurities into the wafer. An Ellingham diagram is useful in determining which materials will not react with the underlying wafer.

Originally developed to find the conditions necessary for the reduction of the ores of important metals, an Ellingham diagram can show the change in Gibbs free energy (ΔG) with respect to temperature for various reactions including oxidation of different metals. Gibbs free energy is generally the capacity of a system to do non-mechanical work and G measures the non-mechanical work done on it.

Equation 6 shows the reduction reaction that may take place when a metal oxide is placed in contact with a silicon substrate. This reaction will result in injection on metallic impurities into the wafer resulting in poor device performance:

$$MO_2 + Si \rightarrow M + SiO_2 \, \Delta G \quad \text{[Equation 6]}$$

$$MO_2 \rightarrow M + O_2 \, \Delta G_1 \quad \text{[Equation 7A]}$$

$$Si + O_2 \rightarrow SiO_2 \, \Delta G_2 \quad \text{[Equation 7B]}$$

The reaction shown in equation 6, can be split into a sum of two half reactions shown in Equations 7A and 7B. Equation 7A can be rewritten as Equation 7C to match the typical format of oxidation reactions:

$$M + O_2 \rightarrow MO_2 \, -\Delta G_1 \quad \text{[Equation 7C]}$$

Figure 4:
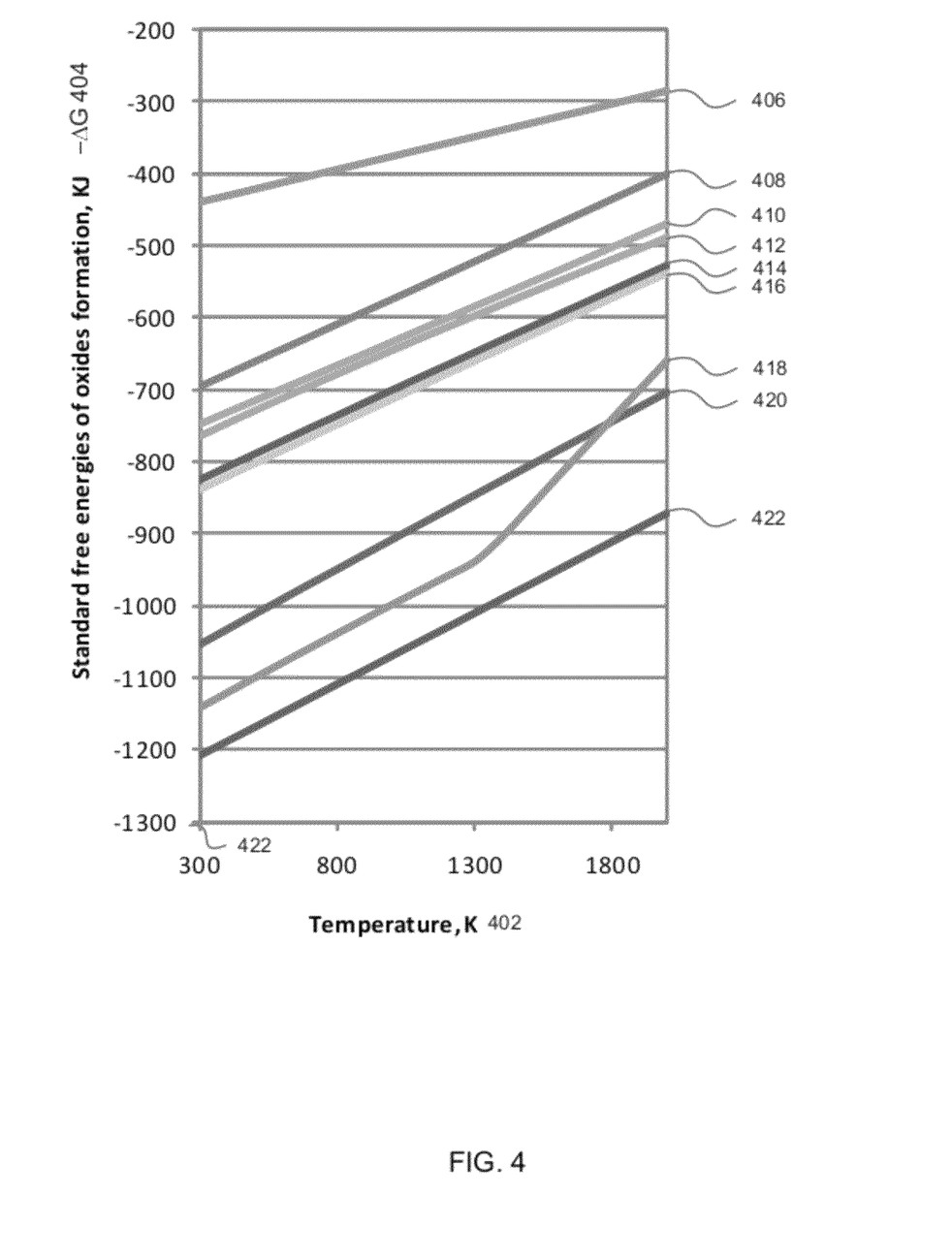
FIG. 4 shows a simplified Ellingham Diagram, in accordance with the invention.

The Gibbs free energy of the overall reaction shown in Equation 6 will then be $\Delta G = -\Delta G_1 + \Delta G_2$. Only metals that result in a positive ΔG are acceptable, as these reactions will not take place. The metals which are compatible with this requirement can be identified from an Ellingham diagram.

Referring to FIG. 4, a simplified Ellingham Diagram is shown, in accordance with the invention. Change in the Gibbs free energy ($-\Delta G_1$) in kJ/mol is shown along vertical axis 304 for multiple oxidation reactions, while the reaction temperature in °K is shown along horizontal axis 302.

Referring to the figure, oxides which result in a greater reduction in free energy than the oxidation of silicon (i.e., below $SiO_2$ plot 414) are thermodynamically stable in contact with silicon at an elevated temperature as they result in a positive $\Delta G$ as described in Equation 6. As a result, no metallic impurities that can degrade the minority carrier lifetime of the wafer will be introduced into the bulk of the wafer. Suitable ceramic materials include ($TiO_2$) 416, aluminum oxide ($Al_2O_3$) 418, magnesium oxide (MgO) 420, and calcium oxide (CaO) 422, and combinations thereof.

Materials with plots above 414 are unsuitable because the reaction with the silicon wafer would be favored, such as iron oxide (406), chromium oxide (408), manganese oxide (410), and tantalum oxide 412.

In addition to the suitable ceramic materials selected on the basis of an Ellingham diagram, several other binary metal oxides have been identified by an alternative thermodynamic analysis and include $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$, and $HfO_2$. (K. J. Hubbard and D. G. Schlom, *Thermodynamic stability of binary metal oxides in contact with Silicon*, J. Mater. Reasearch, v 11(11), 1996).

As for the boron dopant itself, a suitable solid dopant source shall be configured to deliver sufficient dopant while minimizing silicon substrate contamination. For example, suitable dopants include boron nitride (BN), boron oxide ($B_2O_3$), boron carbide ($B_4C$), any of the phases of boron silicide ($B_xSi$), where x=2, 3, 4, 6, and other borides of metals that form silicon compatible binary oxides, such as $TiB_x$, $MgB_x$, $HfB_x$, $GdB_x$, $LaB_x$.

In one configuration, the ceramic material and the boron dopant source are dispersed in a set of solvents, such as alcohols, aldehydes, ketones, carboxylic acids, esters, amines, organosiloxanes, halogenated hydrocarbons, and other hydrocarbon solvents. In addition, the set of solvents may be mixed in order to optimize physical characteristics such as viscosity, density, polarity, etc.

In addition, in order to optimize viscoelastic behavior of the paste for screen printing, a set of high molecular weight (HMW) polymer molecules, called binder, is added. The binder is one of polyacrylates, polyacetals and their derivatives, polyvinyls, a cellulose (including its ethers and esters), and copolymers thereof.

In an alternate configuration, the particle surface of the ceramic material may be treated with a ligand or capping agent in order to disperse in a set of solvents and optimize shear thinning behavior. In general, a capping agent or ligand is a set of atoms or groups of atoms bound to a "central atom" in a polyatomic molecular entity. The capping agent is selected for some property or function not possessed by the underlying surface to which it may be attached.

Figure 5:
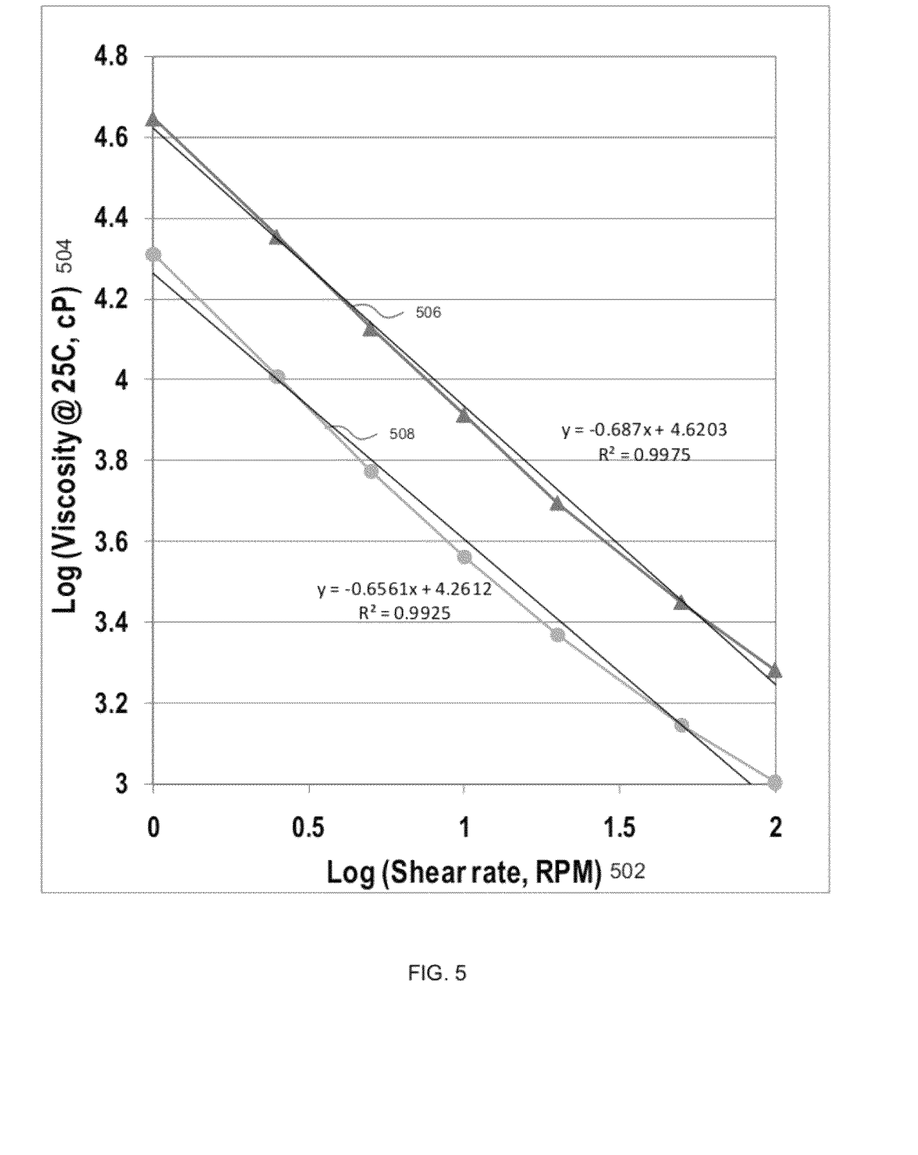
FIG. 5 shows the viscosity profiles for the two boron-containing doping pastes, in accordance with the invention.

Referring to FIG. 5, the viscosity profiles for the two boron-containing doping pastes are shown, in accordance with the invention.

Both sets of boron-containing doping pastes were produced by dispersing a mixture of boron-containing particles and metal oxide particles in a solution of ethyl cellulose binder 1.5% (wt) and 75.5% (wt) terpineol solvent.

On horizontal axis 502 is shown the logarithm of the shear rate in RPM, while on the vertical axis is shown 504 the logarithm of the corresponding viscosity (as measured on a Brookfield viscometer) at 25° C. in centipose (cP).

Plot 506 is comprised of a mixture of 5% (wt.) boron silicide and 12% (wt) aluminum oxide powders in a solution of ethyl cellulose binder 1.5% (wt) and 81.5% (wt) terpineol solvent. Fitting the shape of the viscosity curve with Equation 5, a slope of −0.687 corresponding to an n of 0.313. As previously described, the slope is equivalent to n−1.

Plot 508 is comprised of a mixture of 5% (wt.) boron carbide and 18% (wt) titanium dioxide powders in a solution of ethyl cellulose binder 1.5% (wt) and 75.5% (wt) terpineol solvent. Fitting the shape of the viscosity curve with Equation 5, a slope of −0.6561 corresponding to an n of 0.3439.

Fitting the shape of the viscosity curve with Equation 5 shows that for both formulations, the power law index as is between n=0.3 and n=0.35 indicating a high degree of shear thinning in the fluid as a shearing force is applied, making it compatible with screen printing. In general, based on Equation 5 above, an n between about 0.01 and about 1.0 is preferable, an n between about 0.2 and about 0.8 is more preferable, and an n between about 0.325 is most preferable.

Figure 6:
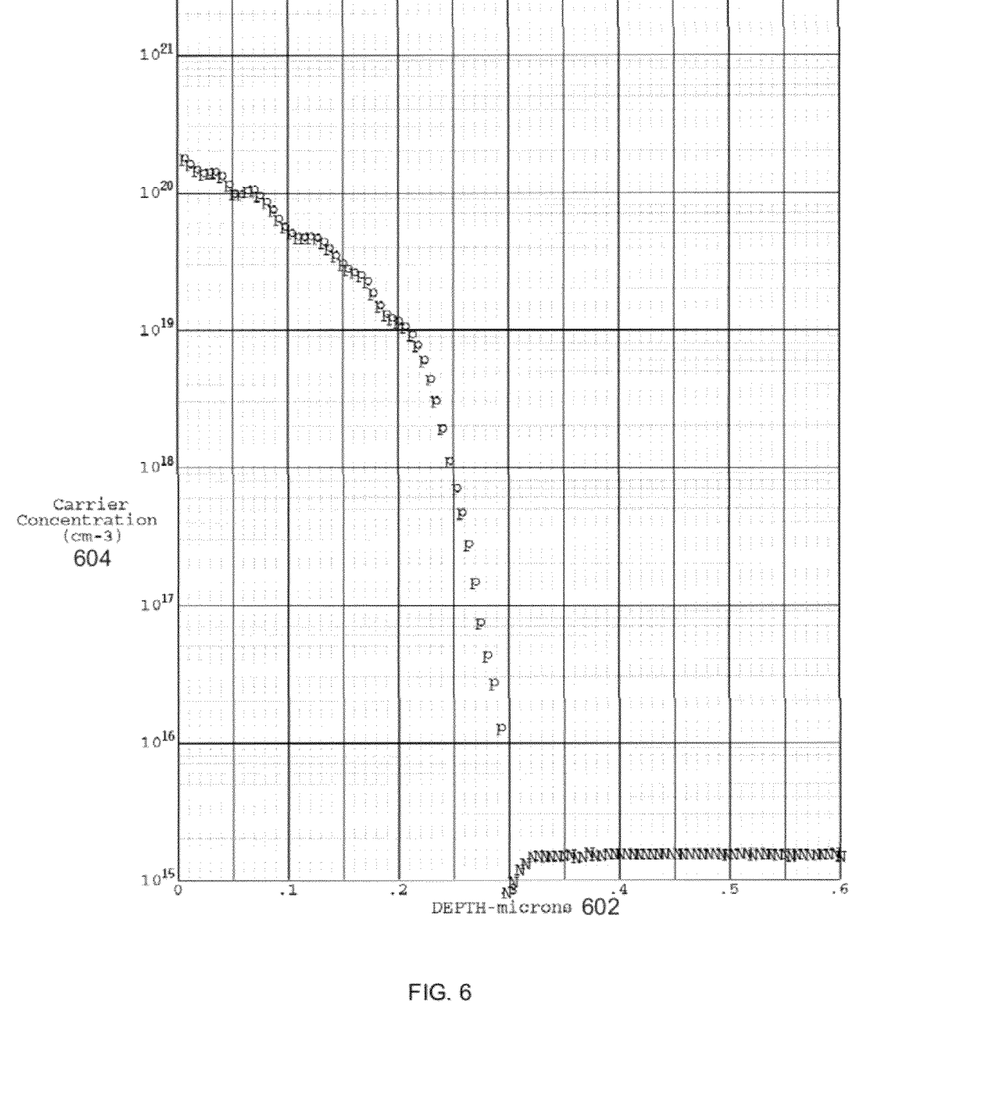
FIG. 6 shows a simplified diagram showing a Spreading Resistance Profile plot of the majority carrier type and concentration in the diffusion region, in accordance with the invention.

Referring now to FIG. 6, a simplified diagram showing a Spreading Resistance Profile plot of the majority carrier type and concentration in the diffusion region, in accordance with the invention. On vertical axis 604 is the carrier concentration in $cm^{-3}$ and on horizontal axis 602 is the depth of the measurement from the surface of an n-type (phosphorous doped) substrate.

A boron-containing doping paste comprising of a mixture of 5% (wt.) boron carbide and 18% (wt) titanium dioxide powders in a solution of ethyl cellulose binder 1.5% (wt) and 75.5% (wt) terpineol solvent was deposited on the n-type substrate that was previously cleaned in an HF solution.

After printing, the wafers were dried in a box oven at 70° C. for 30 minutes to remove the solvent in an ambient containing nitrogen.

Next, the n-type substrate is exposed to about a 6:1 mixture HF/HCl at about room temperature and for about 2 minutes to reduce surface contamination.

Next, the n-type substrate is placed in a diffusion furnace and heated in an $N_2$ ambient at about 900° C. for about 60 minutes in order to diffuse the p-type dopant into the n-type substrate, which is subsequently beveled for generation of the Spreading Resistance Profile plot.

A bias of about 5 mV is applied across two tungsten carbide probe tips placed about 20 um apart onto the doped n-type substrate. Between each measurement along the beveled surface, the probes are raised and indexed a pre-determined distance down the bevel.

As shown in FIG. 6, as a result of the diffusion process, boron dopant has diffused from the printed ceramic boron-containing doping paste into the n-type silicon wafer, resulting in a p-n junction depth of approximately 0.3 microns, an acceptable depth for the formation of a proper contact to the silicon solar cell. Peak concentration of electrically active boron atoms at the substrate surface is approximately $2*10^{20}$ ($1/cm^3$), matching the solid solubility of boron in silicon at the temperature of diffusion.

Figure 7:
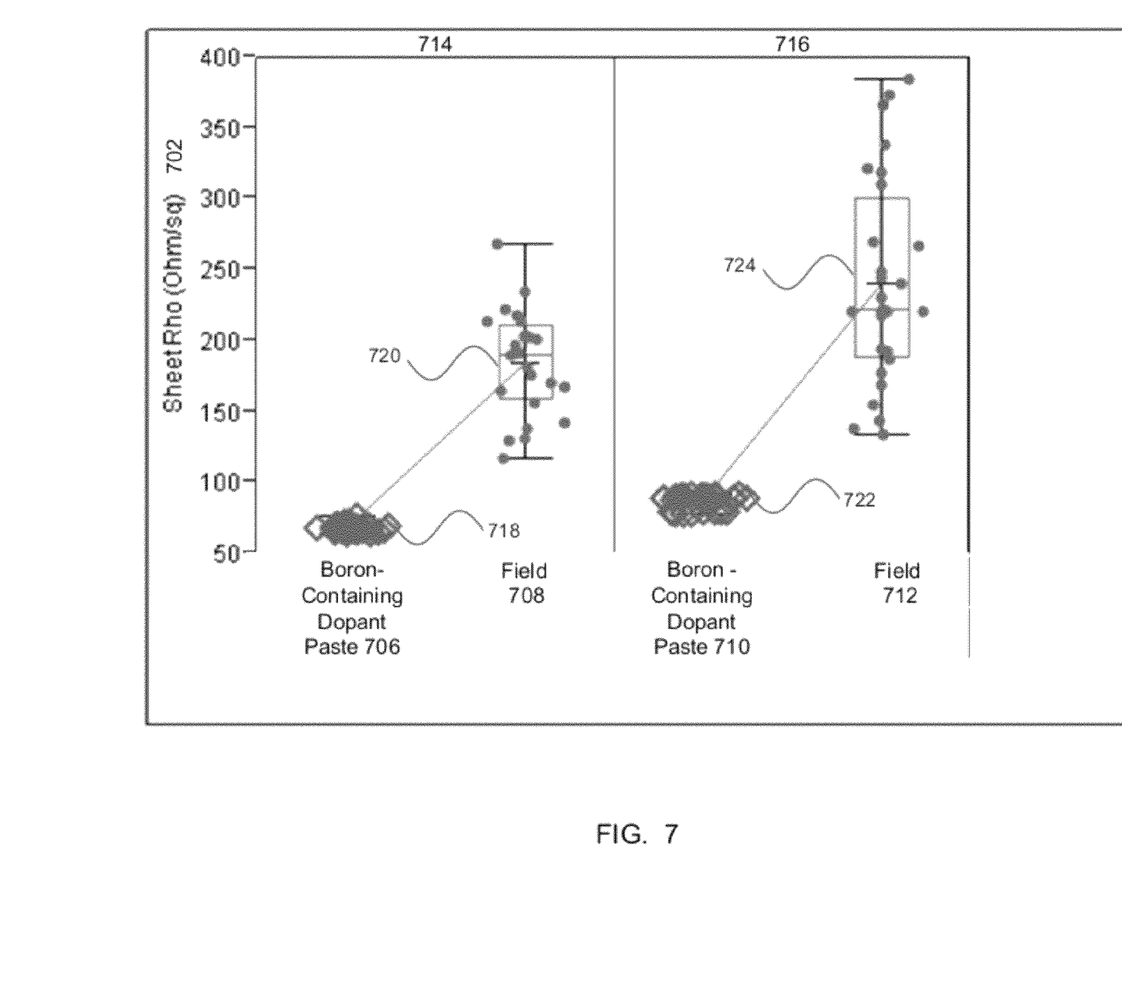
FIG. 7 shows a simplified diagram of a boron dopant diffusion in an n-type substrate as generated with a boron-containing doping paste, in accordance with the invention.

Referring now to FIG. 7, a simplified diagram is shown of boron dopant diffusions in an n-type substrate as generated with two ceramic boron-containing doping pastes, in accordance with the invention. Vertical axis 702 shows the measured sheet resistivity in Ohm/square as measured for substrate areas underneath the deposited ceramic boron-containing doping paste and for field areas (i.e., areas without the printed boron-containing doping paste).

A first ceramic boron-containing doping paste 706 (corresponding to plot 506 in FIG. 5), deposited on n-type substrate 714, was comprised of a mixture of 5% (wt.) boron silicide and 12% (wt) aluminum oxide powders in a solution of ethyl cellulose binder 1.5% (wt) and 81.5% (wt) terpineol solvent.

A second ceramic boron-containing doping paste 710 (corresponding to plot 508 in FIG. 5) as deposited on n-type substrate 716, was comprised of a mixture of 5% (wt.) boron carbide and 18% (wt) titanium dioxide powders in a solution of ethyl cellulose binder 1.5% (wt) and 75.5% (wt) terpineol solvent.

Each ceramic boron-containing doping paste was deposited onto an n-type silicon substrate that was previously cleaned in an HF solution. After deposition, the substrate was dried in a box oven at 70° C. for 30 minutes to remove the solvent. The substrate was then immersed in a dilute aqueous HF:HCl mixture to reduce surface contamination. After a DI water rinse and drying, the substrate was heated in a hot wall diffusion tube in an inert ambient at 900° C. for one hour.

Doping under the ceramic boron-containing doping paste and in the unprinted field areas were then measured using a sheet resistivity four point probe measurement.

Referring to substrate 714, the region under the ceramic boron-containing doping paste was substantially p-type, with a resistivity between about 60 Ohm/sq and about 80 Ohm/sq, with an average of about 70 Ohm/sq. The field region 708 was substantially n-type, with a much higher resistivity between about 100 Ohm/sq and about 275 Ohm/sq, with an average of about 180 Ohm/sq, corresponding to the bulk of the n-type wafer.

Referring to substrate 716, the region under the ceramic boron-containing doping paste was substantially p-type, with a resistivity between about 70 Ohm/sq and about 90 Ohm/sq, with an average of about 80 Ohm/sq. The region under field 708 was substantially n-type, with a much higher resistivity between about 125 Ohm/sq and about 375 Ohm/sq, with an average of about 225 Ohm/sq, corresponding to the bulk of the n-type wafer.

Consequently, it is shown that the ceramic boron-containing paste is counter-doping the n-type substrate with boron (p-type) dopant.

Figure 8:
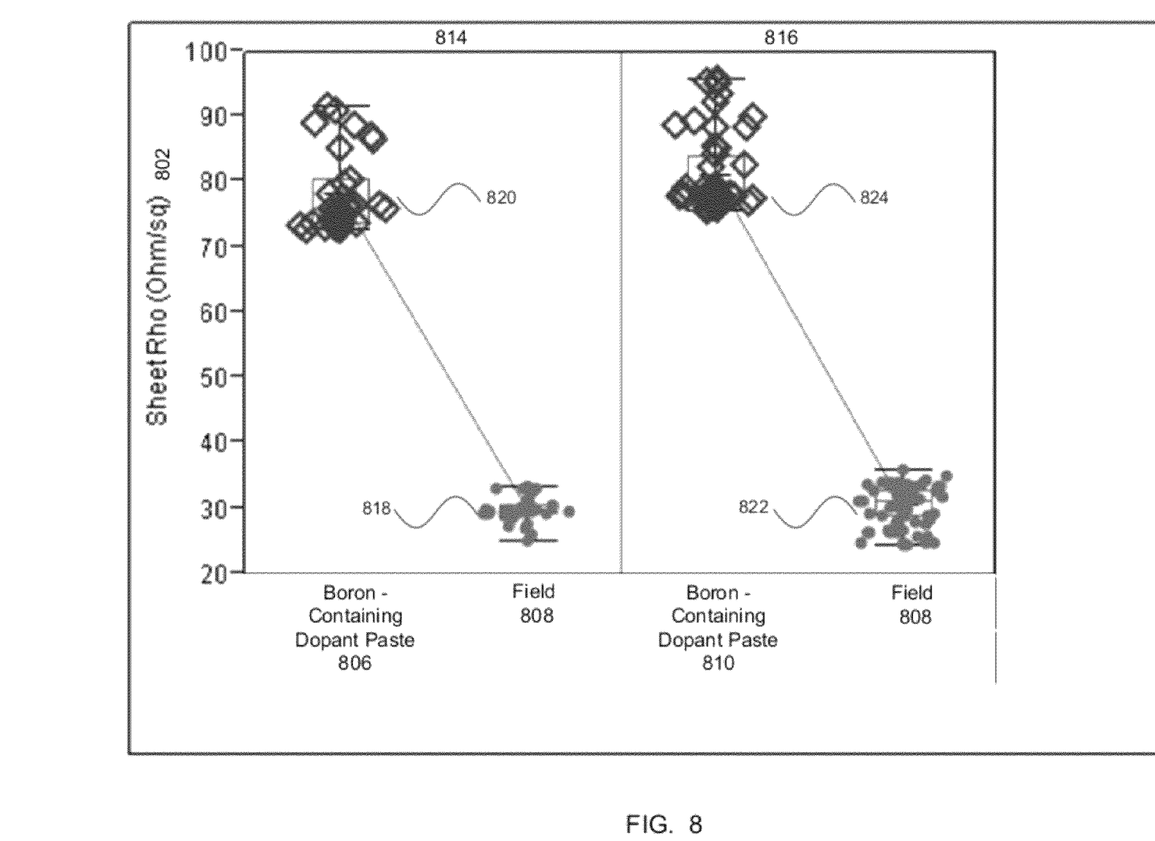
FIG. 8 shows a simplified diagram of a boron dopant diffusion and a phosphorous dopant diffusion on an n-type substrate, in accordance with the invention; and, FIG. 9 shows a simplified process for the manufacture of boron-containing doping paste, in accordance with the invention.

Referring now to FIG. 8, a simplified diagram is shown of simultaneous boron dopant diffusion (as generated with boron-containing doping paste) and phosphorous dopant diffusion (as generated with a POCl$_3$ process) on an n-type substrate, in accordance with the invention.

Vertical axis 802 shows the measured sheet resistivity in Ohm/square as measured for substrate areas underneath the deposited boron-containing doping paste and for field areas (i.e., areas without the deposited boron-containing doping paste).

A first boron-containing paste 806 (corresponding to plot 506 in FIG. 5), deposited on n-type substrate 814, was comprised of a mixture of 5% (wt.) boron silicide and 12% (wt) aluminum oxide powders in a solution of ethyl cellulose binder 1.5% (wt) and 81.5% (wt) terpineol solvent.

A second boron-containing paste 810 (corresponding to plot 508 in FIG. 5) as deposited on n-type substrate 816, was comprised of a mixture of 5% (wt.) boron carbide and 18% (wt) titanium dioxide powders in a solution of ethyl cellulose binder 1.5% (wt) and 75.5% (wt) terpineol solvent.

Each boron-containing paste was screen printed onto an n-type silicon substrate that was previously cleaned in an HF solution. After deposition, the substrate was dried in a box oven at 70° C. for 30 minutes to remove the solvent. The substrate was then immersed in a dilute aqueous HF:HCl mixture to reduce surface contamination.

After a DI water rinse and drying, the substrate was heated in a hot wall diffusion tube in an inert ambient at 900° C. for one hour followed by exposure to a phosphorous (n-type) dopant source in a diffusion furnace with an atmosphere of POCl$_3$, N$_2$, and O$_2$, at a temperature of about 850° C. for about 60 minutes. The residual PSG glass layer on the substrate surface was subsequently removed by a BOE cleaning step for 5 minutes.

Doping under the boron-containing paste printed regions and in the field areas unprotected to the POCl$_3$ exposure by the paste was then measured using a sheet resistivity four point probe measurement. Majority carrier type was determined using a hot-probe measurement.

Referring to substrates 814 and 816, although the substrate was exposed to POCl$_3$, the region under boron-containing paste was still substantially p-type, with a resistivity between about 70 Ohm/sq and about 90 Ohm/sq, with an average of about 80 Ohm/sq. The region under field 808 was substantially n-type, with a lower resistivity (due to the POCl$_3$ diffusion process) between about 25 Ohm/sq and about 35 Ohm/sq, with an average of about 30 Ohm/sq.

Consequently, it is shown that the boron-containing paste is both counter-doping the n-type substrate, and blocks ambient phosphorous generated during the POCl$_3$ diffusion process.

Figure 9:
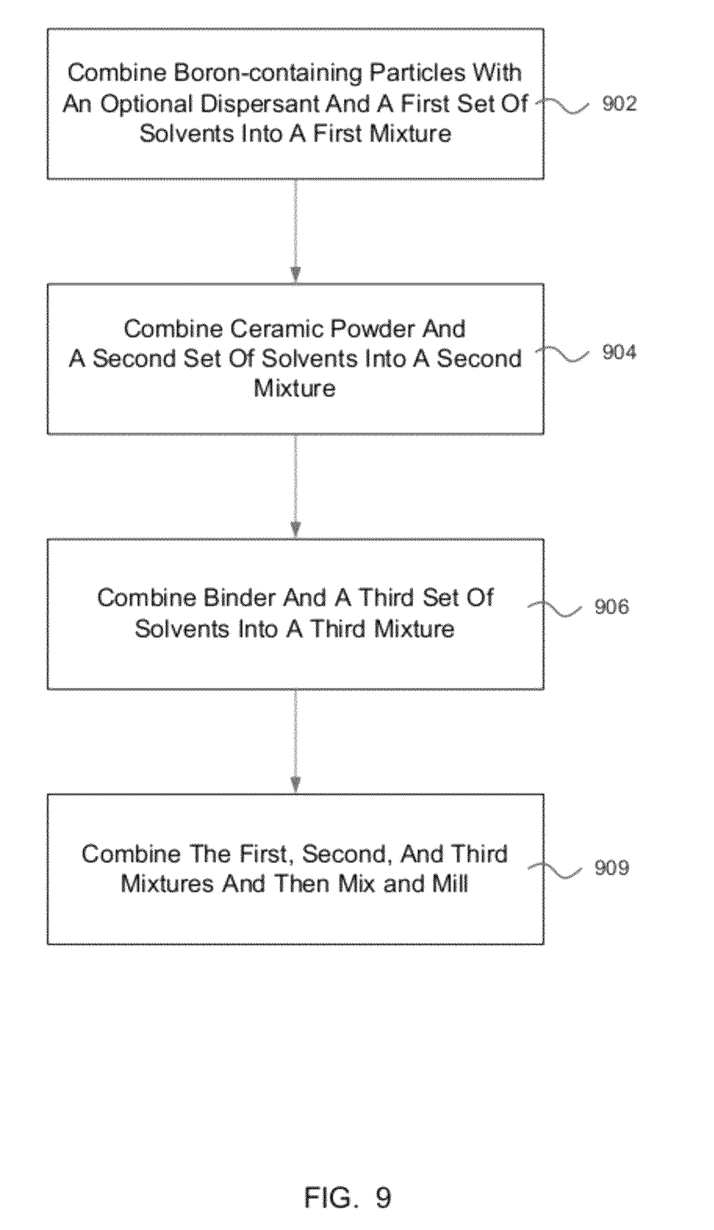

Referring now to FIG. 9 a simplified sample process for the manufacture of a boron-containing doping paste is shown, in accordance with the invention. At step 902, the boron-containing particles are combined with an optional dispersant and a first set of solvents into a first mixture. At step 904, ceramic particles are combined with a second set of solvents into a second mixture. At step 906, a binder is combined with a third set of solvents in a third mixture. Finally at 908, the first, second, and third mixtures are combined and then mixed and milled.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

As will be understood by one skilled in the art, for any and all purposes, particularly in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. In addition, the terms "dopant or doped" and "counter-dopant or counter-doped" refer to a set of dopants of opposite types. That is, if the dopant is p-type, then the counter-dopant is n-type. Furthermore, unless otherwise dopant-types may be switched. In addition, the silicon substrate may be either mono-crystalline or multi-crystalline.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention include a doping paste that is resilient to high temperature oxidizing processes (such as the $POCl_3$ diffusion process), is able to mask ambient $POCl_3$, and is compatible with HF-based acidic cleaning chemistries.

Having disclosed exemplary embodiments and the best mode, modifications and variations may be made to the disclosed embodiments while remaining within the subject and spirit of the invention as defined by the following claims.

What is claimed is:

1. A dopant paste comprising:
a set of solvents;
a set of ceramic particles dispersed in the set of solvents;
a set of boron compound particles dispersed in the set of solvents;
a set of binder molecules dissolved in the set of solvents;
wherein the ceramic boron-containing dopant paste has a shear thinning power law index n between about 0.01 and about 1, wherein the set of boron compound particles consists of at least one boron compound selected from the group consisting of boron nitride (BN), boron oxide ($B_2O_3$), boron carbide ($B_4C$), any of the phases of boron silicide ($B_xSi$), where x=2,3,4,6, $TiB_x$, $MgB_x$, $HfB_x$, $GdB_x$, and $LaB_x$ and wherein the set of boron compound particles is between 1 and 20% wt of the paste.

2. The dopant paste of claim 1, wherein the shear thinning power law index n is between 0.1 and 0.8.

3. The dopant paste of claim 1, wherein the shear thinning power law index n is 0.3.

4. The dopant paste of claim 1, wherein the set of ceramic particles is between 3 and 30% wt of the paste.

5. The dopant paste of claim 1, wherein the set of ceramic particles is between 5 and 20% wt of the paste.

6. The dopant paste of claim 1, wherein the set of ceramic particles is 12% wt of the paste.

7. The dopant paste of claim 1, wherein the set of ceramic particles includes at least one of $TiO_2$, $Al_2O_3$, MgO, and CaO.

8. The dopant paste of claim 1, wherein the set of ceramic particles includes at least one of $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$, and $HfO_2$.

9. The dopant paste of claim 1, wherein the set of boron compound particles is between 3 and 10% wt of the paste.

10. The dopant paste of claim 1, wherein the set of boron compound particles is 5% wt of the paste.

11. The dopant paste of claim 1, wherein the set of binder molecules is between 0.5 and 3% wt of the paste.

12. The dopant paste of claim 1, wherein the set of binder molecules is between 0.75 and 2% wt of the paste.

13. The dopant paste of claim 1, wherein the set of binder molecules is 1.5% wt of the paste.

14. The dopant paste of claim 1, wherein the set of binder molecules is ethyl cellulose.

15. The dopant paste of claim 1, wherein the set of solvents comprises terpineol.

16. A dopant paste comprising:
a set of solvents;
a set of ceramic particles dispersed in the set of solvents;
a set of boron compound particles dispersed in the set of solvents;
a set of binder molecules dissolved in the set of solvents;
wherein the ceramic boron-containing dopant paste has a shear thinning power law index n between about 0.01 and about 1, wherein the set of boron compound particles includes at least one of boron nitride (BN), boron carbide ($B_4C$), any of the phases of boron silicide ($B_xSi$), where x=2,3,4,6, $TiB_x$, $MgB_x$, $HfB_x$, $GdB_x$, and $LaB_x$ and wherein the set of ceramic particles is between 3 and 30% wt of the paste and wherein the set of boron compound particles is between 1 and 20% wt of the paste.

17. The dopant paste of claim 16, wherein the set of ceramic particles includes at least one of $TiO_2$, $Al_2O_3$, MgO, and CaO.

18. The dopant paste of claim 16, wherein the set of ceramic particles includes at least one of $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$, and $HfO_2$.

* * * * *